United States Patent [19]

Lunn et al.

[11] 4,399,561
[45] Aug. 16, 1983

[54] VARIABLE CAPACITANCE CIRCUIT

[75] Inventors: Gerald K. Lunn, Scottsdale; Michael McGinn, Tempe, both of Ariz.

[73] Assignee: Motorola, Inc., Schaumburg, Ill.

[21] Appl. No.: 220,609

[22] Filed: Dec. 29, 1980

[51] Int. Cl.³ .............................................. H04B 1/16
[52] U.S. Cl. .................................. 455/266; 455/339; 455/233; 333/178
[58] Field of Search ............... 455/230, 232, 233, 234, 455/248, 250, 338, 339, 193, 289, 266; 330/144, 145; 333/124, 17. M, 24. C, 167, 172, 178, 177; 334/40; 358/133, 195.1, 158, 174, 175

[56] References Cited

U.S. PATENT DOCUMENTS

| | | | |
|---|---|---|---|
| 2,071,902 | 2/1937 | Rust | 455/266 |
| 2,927,997 | 3/1960 | Day | 455/266 |
| 3,528,014 | 9/1970 | Albee | 455/266 |
| 3,541,451 | 11/1970 | Lind | 455/266 |
| 3,636,119 | 1/1972 | Balbes | 455/339 |
| 3,872,387 | 3/1975 | Banach | 455/266 |
| 4,178,551 | 12/1979 | Ogta | 455/266 |

*Primary Examiner*—Tommy P. Chin
*Attorney, Agent, or Firm*—Michael D. Bingham

[57] ABSTRACT

A circuit having a variable input impedance which is controlled by application of a direct current input signal. The variable impedance circuit comprises a pair of capacitors coupled in series with a pair of diodes. The diodes are rendered conductive in response to the direct current control signal to substantially short the two capacitors in series with one another across the input terminals of the circuit. With no direct control signal being applied to the circuit the diodes are non-conductive which substantially disconnects the capacitors from appearing across the inputs of the circuit. Hence, the reactance component of the input impedance of the circuit is varied in response to the direct control signal.

10 Claims, 6 Drawing Figures

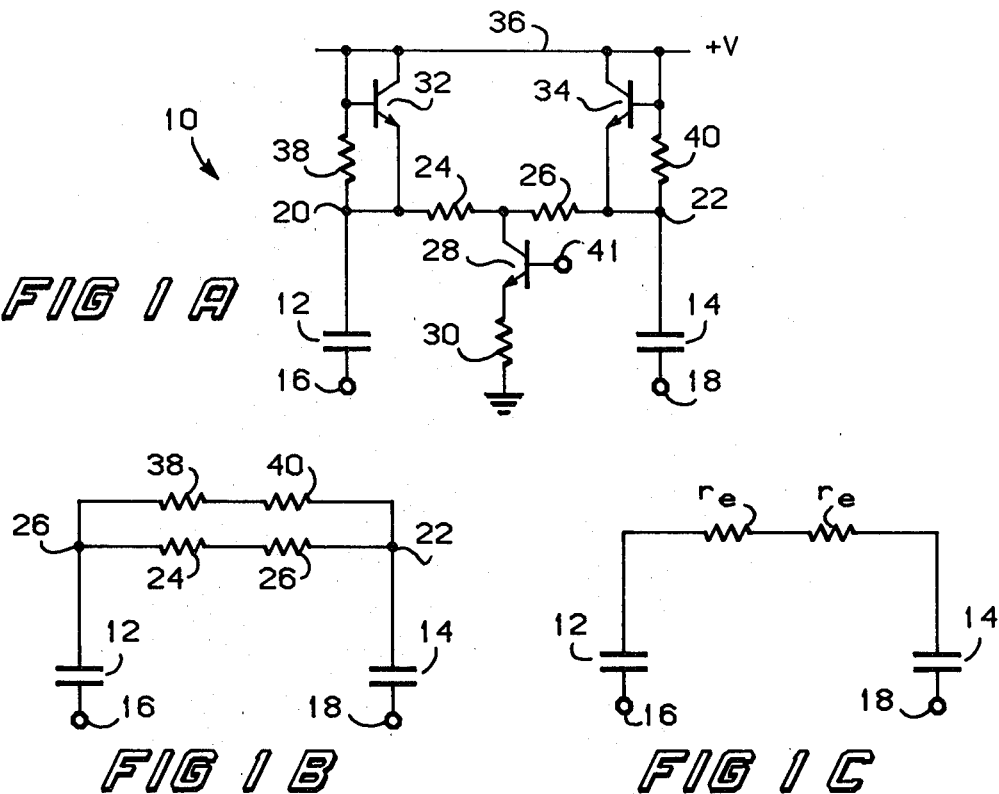
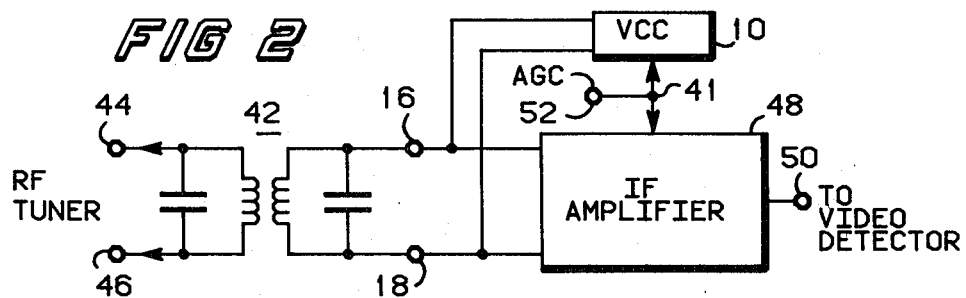
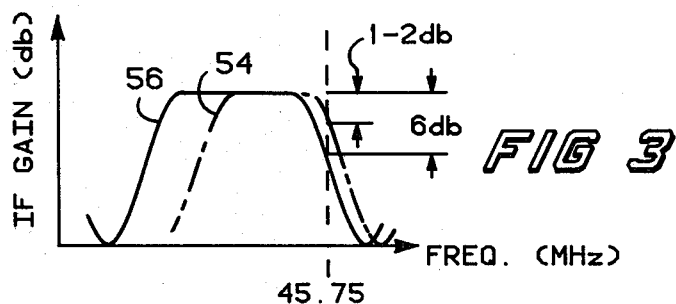

VARIABLE CAPACITANCE CIRCUIT

BACKGROUND OF THE INVENTION

1. Field of the Invention

The present invention relates to a circuit having a controlled impedance and more particularly to a circuit suitable for use at the input of an IF amplifier stage which is responsive to a gain control signal for varying the capacitance across a tuned bandpass filter coupled to the input of the IF amplifier stage for varying the frequency response thereof.

2. Description of the Prior Art

It is generally known that the bandpass characteristics of a tuned circuit can be varied by varying the reactance components comprising the same. Additionally, it is also known how to utilize tuned stages for providing bandpass characteristics to IF amplifier stages used in radio and television applications. For instance, see Buchsbaum, Fundamentals of Television (1964) pages 121–129 for a good description of a picture IF section of a typical television receiver. It has generally been established that the required video IF bandwidth of a television receiver should change with signal strength for optimum picture quality. Hence, with a strong input signal and a high signal to noise ratio, the bandwidth should be as wide as possible within the limitations of the incoming signal. Generally, the video carrier should be at −6 dB relative to the main bandpass to achieve correct transient performance for the video signal as is understood.

However, under low signal conditions, i.e., weak input signals with poor signal to noise ratio, a superior picture is obtained when the bandwidth of the video IF amplifier section of the television receiver is narrower and the picture carrier is only −1 or −2 dB relative to the main bandpass characteristics of the amplifier stage.

In the past this "blocking" of the IF bandpass circuit has been achieved by appropriate matching of filter elements of the IF amplifier stage to one or more discrete transistor amplifier elements which are under AGC control; i.e., the input or output impedance variation produced by gain control of the discrete transistor is used to move the filter pole/poles appropriately. A problem with this scheme is that the characteristic of the discrete transistor stage is subject to large variations between devices and so the characteristics of the bandpass modification is somewhat unpredictable.

Typically, integrated circuit structures such as the Motorola MC1349 "IF Amplifier" used for IF amplifier stages in a television receiver did not lend themselves easily to the aforedescribed treatment because they are designed for direct current coupling to following stages. Thus, large parameter changes are quite difficult to accommodate.

Thus, a need exists for a circuit to be utilized with an integrated IF amplifier circuit that can be used to vary the IF bandpass characteristics of the amplifier section to compensate for varying signal strengths while providing maximum picture quality in a television receiver.

SUMMARY OF THE INVENTION

Accordingly, it is an object of the present invention to provide a variable capacitance circuit.

It is another object of the present invention to provide a variable capacitance circuit which may be utilized with tuned IF amplifier sections of radio and television receivers for varying the bandpass characteristics thereof to compensate for varying levels of incoming input signals.

A further object of the present invention is to provide a variable capacitance circuit which is responsive to an automatic gain control signal for changing the IF filter characteristics of a tuned IF amplifier stage.

Still another object of the present invention is to provide a variable capacitance circuit suitable for utilization in a large scale integrated television receiver chip for varying the bandpass characteristics of the IF amplifier section thereof.

In accordance with the above and other objects there is provided a variable capacitance circuit suitable for being fabricated in integrated circuit form and comprising first and second capacitors in series with first and second diodes. In response to an applied gain control signal the first and second diodes are rendered conductive to substantially place the capacitors in series with one another across a pair of input terminals; in the absence of the gain control signal the diodes are rendered non-conductive such that the first and second capacitors are essentially disconnected from each other whereby the capacitance appearing at the input terminals of the variable capacitance circuit is made variable.

BRIEF DESCRIPTION OF THE DRAWINGS

FIG. 1A is a schematic diagram of the variable capacitance circuit of the preferred embodiment of the present invention;

FIG. 1B is a schematic representation of a first equivalent circuit of the variable capacitance circuit of FIG. 1A;

FIG. 1C is a second schematic diagram of the equivalent circuit of FIG. 1A;

FIG. 2 is a partial schematic and block diagram of an IF amplifier section incorporating the variable capacitance circuit of the present invention;

FIG. 3 shows waveforms useful in describing the operation of the present invention;

DETAILED DESCRIPTION OF THE PREFERRED EMBODIMENT

Figure 4:
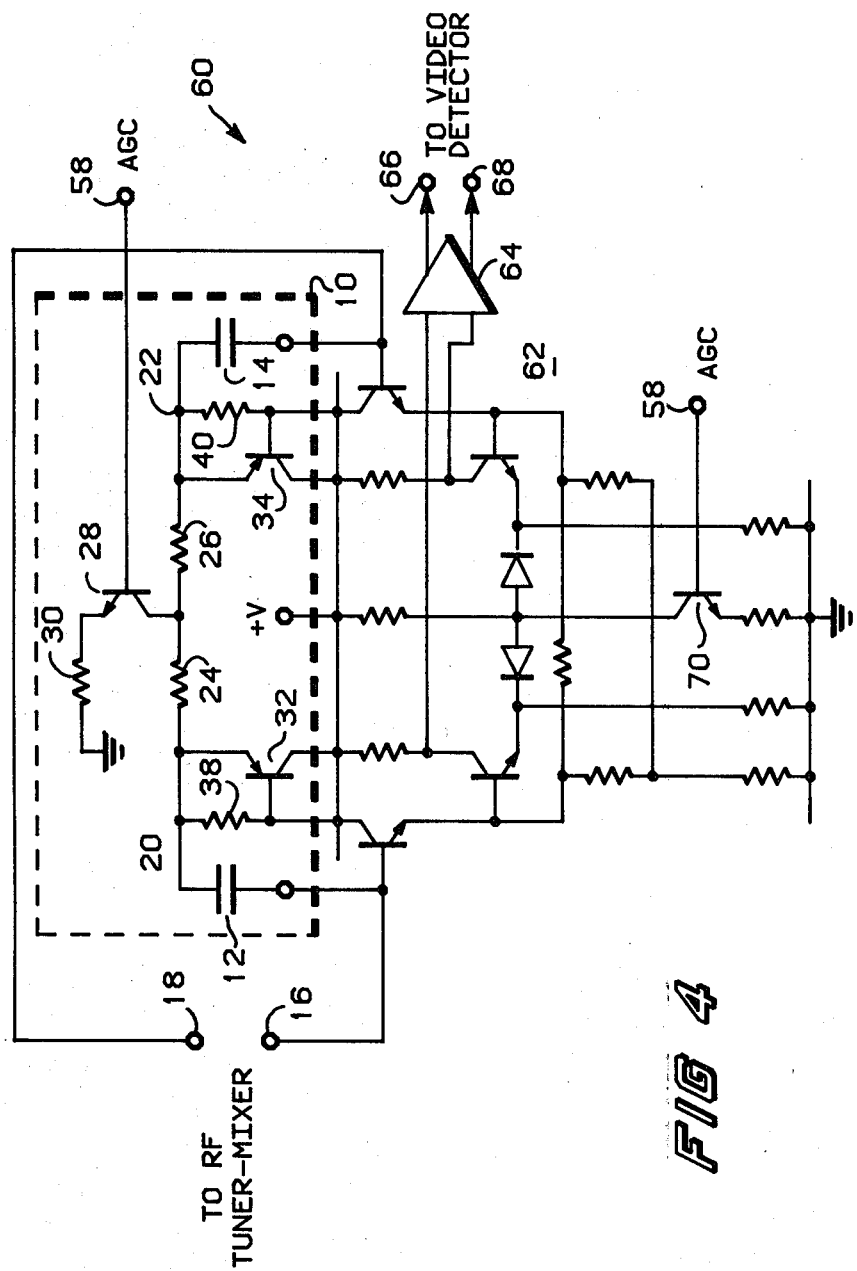
FIG. 4 is a partial schematic in block diagram showing the variable capacitance circuit of FIG. 1 coupled with a typical amplifier stage.

Turning to FIG. 1A there is shown variable capacitance circuit 10 comprising a pair of capacitors 12 and 14 each having one plate thereof coupled to input terminal 16 and 18 of the circuit. The other plates of capacitors 12 and 14 are connected respectively to nodes 20 and 22 in series with resistors 24 and 26 coupled therebetween. Capacitors 12 and 14 are also in series with diode coupled connected transistors 32 and 34. Resistors 38 and 40 are coupled in parallel with the diodes 32 and 34 between nodes 20 and 22 and power supply conductor 36 which is adapted to receive a source of operating potential. The interconnection between resistors 24 and 26 is coupled to a gain control transistor 28 having its collector to emitter path coupled in series with a resistor 30 to ground reference. The base of gain control transistor 28 is adapted to receive a gain control signal at terminal 41.

In operation, without any gain control being supplied to terminal 41, transistor 28 is rendered non-conductive. In this condition, diode connected transistors 32 and 34 are also maintained non-conductive such that the series connection of resistors 38 and 40 are coupled in parallel with the series resistors 24 and 26 which essentially produces an open circuit between input terminal 16 and 18 as shown in FIG. 1B. However, in response to the gain control signal being supplied to the input terminal 41 transistor 28 will be rendered conductive to render transistor 32 and 34 conductive which in the extreme limitations will substantially short nodes 20 and 22 together except for the small diode resistance of the two transistors as is shown in FIG. 1C. In this condition, the input impedance appearing at input terminal 16 and 18 is made capacitive and being equal to the capacitance resulting from the series connection of capacitors 12 and 14.

In a preferred embodiment, although not limited thereto, variable capacitance circuit 10 may be utilized in conjunction with the intermediate frequency (IF) amplifier section of a radio or television receiver for changing the bandpass characteristics in response to an automatic gain control signal. As an example, variable capacitance circuit 10 is shown in FIG. 2 as being coupled with the input of an IF amplifier stage in a typical television receiver. As generally understood, a tuned IF amplifier stage is utilized in the television having at least one tuned section 42 which is coupled at the input thereof at input terminals 44 and 46 to the RF tuner and mixer portion of the television receiver. The IF amplifier stage 48 is coupled to terminals 16 and 18 with variable capacitance circuit 10 with the output of the amplifier stage being coupled to the video detector of the television receiver at terminal 50. An automatic gain control signal is applied via lead 52 to both the variable capacitance circuit 10 and the IF amplifier stage 48 in order to maintain a substantially constant output to the video detector portion of the television receiver.

In a typical television receiver the automatic gain control signal is a function of the received incoming composite television signal and it is generally increased with stronger signals in order to reduce the gain of the IF amplifier stage of the television receiver. In outlying areas or when the television composite signal is weak, the gain of the IF amplifier stage is increased by reducing the gain control signal to this stage. Thus, with a strong input signal, there will be supplied via lead 52 to both variable capacitance circuit 10 and IF amplifier stage 48 a gain control signal as known. For optimum picture quality with the strong input signal the bandwidth of the IF amplifier should be as wide as possible as shown by waveform 56 of FIG. 3 such that the picture carrier which occurs at the frequency 45.75 megaHertz is approximately 6 dB down from the center of the bandpass. In this condition, the automatic gain control signal would be supplied to terminal 41 of variable capacitor circuit 10 to render it conductive and therefore to place the series capacitors 12 and 14 in parallel with the capacitor of the tuned stage 42. The bandpass characteristics of the tuned stage can be so designed that with series capacitors 12 and 14 adding to the total capacitance of the tuned stage the bandpass characteristics is as shown by waveform 56. However, with weak input signals (no AGC signal) transistor 28 of variable capacitor circuit 10 would be rendered non-conductive thereby reducing the total capacitance of the tuned stage 42. This results in a narrowing of the bandwave bandpass characteristics of the tuned circuit and a shifting of the center frequency upwards as shown by waveform 54. By narrowing the bandpass characteristics of the tuned stage and shifting the center frequency thereof, the picture carrier frequency is moved up such that as shown it occurs only at a −1 or 2 dB below the center pass band of the bandpass characteristics. This results in a walking of the IF bandpass circuit to compensate for varying levels of input signals. Hence, the variable capacitor circuit 10 which is suitable to be utilized in integrated circuit form may be used in a large scale integrated television receiver circuit to maximize the picture qualitfes of the television receiver between strong and weak received signals.

Variable capacitor circuit 10 could very well be utilized with existing integrated IF amplifier circuits as for example the Motorola1349 IF amplifier circuit as previously mentioned. Moreover, as shown in FIG. 4, variable capacitor circuit 10 may be utilized with the input amplifier stage 62 of a multistage IF amplifier section including further IF amplifier stages 64 which can be fabricated in a single large scale integrated circuit as disclosed in U.S. patent application, Ser. No. 220,607, entitled "Large Scale, Single Chip Integrated Circuit Television Receiver Subsystem" which is incorporated herein by reference. The output of the IF amplifier section taken at output terminal 66 and 68 could be supplied to a video detector described in U.S. patent application, Ser. No. 220,329, entitled "Linear Full Wave Rectifier Circuit" also incorporated herein by reference. Hence, in response to the gain control signal supplied at terminals 58 the bandpass characteristics of the tuned input stage coupled to input terminals 16 and 18 would be varied as previously described as the gain of amplifier stage 62 is also varied. The gain of amplifier stage 62 is maximum in the absence of an AGC signal and is decreased to a minimum by transistor 70 being rendered by the AGC signal which tends to decouple the differential transistor pairs of amplifier 62 from one another such that the differential gain is decreased.

Thus, what has been described, is a variable capacitor circuit which may be utilized to vary the bandpass characteristics of an IF amplifier section and which is a completely balanced circuit to both direct current and alternating current signals to maintain maximum gain and stability over the full AGC range of the automatic gain controlled signal which is applied thereto. By utilizing nitride capacitors in series with diodes with impedance controlled by the automatic gain control signal the aforementioned balance conditions were achieved with the direct current control signal being isolated from the amplifier input by use of the capacitors. The capacitors being of small value typically 9 picofarads allows for the same to be fabricated onto the integrated circuit chip comprising the variable capacitor circuit.

A variable capacitance circuit was fabricated using the aforedescribed teachings with resistors 24, 26, 38 and 40 being approximately 6,000 ohms and capacitors 12 and 14 being 9 picofarads. It has been shown with these values that a net 4–5 picofarad capacitance change occurs across input terminals 16 and 18 as transistor 28 is changed from a non-conductive to a full conducting state by application of a direct current signal at the base thereof.

We claim:
1. Circuit for providing a variable and controlled capacitive impedance across a pair of input terminals thereof, comprising:
 first and second capacitive means each having a first end coupled to a respective one of the pair of input terminals of the circuit and a second end; and
 variable impedance means connected in series between said second ends of said first and second capacitive means, said variable impedance means receiving a control signal such that the impedance thereof is varied in response to said control signal wherein the impedance of the conductive path between said first and second capacitive means is varied which causes the total capacitive impedance developed across the pair of input terminals to be varied.

2. Circuit for providing a variable and controlled impedance across a pair of input terminals thereof, comprising:

first and second capacitive means each having a first end coupled to a respective one of the pair of input terminals of the circuit;

variable impedance means coupled in series between second ends of said first and second capacitive means, said variable impedance means receiving a control signal such that the value of impedance thereof is varied in response to said control signal wherein the total capacitance developed across the pair of input terminals is varied;

said variable impedance means including first and second power supply conductors;

first and second diode means each having first and second electrodes, said first electrode of said first and second diode means being coupled to said respective second end of said first and second capacitive means, said second electrodes each being coupled to said first power supply conductor;

first and second serially connected resistors coupled between said first electrodes of said first and second diode means; and switch means coupled between the interconnection of said first and second serially connected resistors and said second power supply conductor, said switch means being rendered responsive to said control signal for causing said first and second diode means to become conductive to vary said variable impedance.

3. The circuit of claim 2 wherein said switch means being a transistor having first, second and control electrodes, said first and second electrodes being coupled to said interconnection of said first and second serially connected resistors and said second power supply conductor, said control electrode receiving said control signal.

4. In combination with an amplifier section having a first and a second inputs coupled to a balanced tuned input circuit, a circuit for varying the bandpass characteristics of the amplifier section, comprising:

first capacitive means having first and second leads, said first lead being coupled to said first balanced tuned input;

second capacitive means having first and second leads, said first lead being coupled to said second balanced tuned input;

impedance means having a variable impedance value which is varied in response to a control signal such that said first and second capacitive means are coupled in series with each other to vary the bandpass characteristics in response to said control signal, said impedance means being coupled between said second leads of said first and second capacitive means;

said impedance means including first diode means having first and second electrodes, said first electrode being coupled at a first node to said second lead of said first capacitive means, said second lead being coupled to a first terminal at which is supplied a source of operating potential, second diode means having first and second electrodes, said first electrode being coupled at a second node to said second lead of said second capacitive means, said second electrode being coupled to said first terminal, first and second resistive means coupled in series between said first and second nodes, and switch means being responsive to said control signal for rendering said first and second diode means conductive to connect said first and second capacitive means in series through a low impedance path such that the capacitiance of the balanced tuned input is varied.

5. The circuit of claim 4 wherein said switch means being a transistor having first, second and control electrodes, said control electrode receiving said control signal, said first electrode being coupled to a second terminal at which is supplied a reference potential, said second electrode being coupled to the interconnection of said serially coupled first and second resistors.

6. In a large scale integrated television receiver circuit including an intermediate frequency amplifier section differentially coupled to a balanced resonance tuned input stage and an automatic gain control circuit for providing a gain control signal, a circuit for varying the bandpass characteristics and center frequency of the intermediate frequency amplifier section in response to the gain control signal, comprising:

first capacitive means having first and second plates, said first plate being coupled to a first differential input of the intermediate frequency amplifier section;

second capacitive means having first and second plates, said first plate being coupled to the second differential input of the intermediate amplifier section;

variable impedance means coupled at first and second nodes to respective second plates of said first and second capacitive means and receiving the gain control signal for varying the impedance between said second plates from a high impedance value to a low impedance value such that said first and second capacitive means are serially connected through a low impedance path in response to the gain control signal which cause the total capacitance of the resonance tuned stage to be varied such that the bandpass characteristic as will as the center frequency are varied accordingly, said first and second capacitive means being connected through a high impedance path relative to said low impedance path in the absence of the gain control signal.

7. In a large scale integrated television receiver circuit including an intermediate frequency amplifier section differentially coupled to a balanced tuned input stage and an automatic gain control circuit for providing a gain control signal, a circuit for varying the bandpass characteristics of the intermediate frequency amplifier section in response to the gain control signal, comprising:

first capacitive means having first and second plates, said first plate being coupled to a first differential input of the intermediate frequency amplifier section;

second capacitive means having first and second plates, said first plate being coupled to the second differential input of the intermediate amplifier section;

impedance means coupled at first and second nodes to respective second plates of said first and second capacitive means and receiving the gain control signal such that said first and second capacitive means are serially connected through a low impedance path in response to the gain control signal such that the bandpass characteristic is varied accordingly, said first and second capacitive means being connected through a high impedance path relative to said low impedance path in the absence of the gain control signal; and said impedance means including first diode means having first and second electrodes, said first electrode being coupled to said first node, said second electrode being coupled to a first terminal at which is supplied a source of operating potential; second diode means having first and second electrodes, said first electrode being coupled to said second node, said second electrode being coupled to said first terminal; switching means being responsive to said control signal for rendering said first and second diode means conductive.

8. The circuit of claim 7 wherein said switching means includes:
   a first resistor coupled between said first node and a third node;
   a second resistor coupled between said second node and said third node; and
   a transistor having first, second and control electrodes, said control electrode receiving the gain control signal, said first electrode being coupled to a second terminal at which is supplied a reference potential for the intermediate frequency amplifier section, said second electrode being coupled to said third node.

9. In a large scale integrated television receiver including an intermediate frequency amplifier section receiving a gain control signal and being differentially coupled to a balanced tuned input stage to the radio frequency section and an automatic gain control circuit for providing said gain control signal, a method for controlling the bandpass characteristic of the amplifier section comprising the steps of:
   providing first and second integrated capacitive means each coupled to a respective input of the differentially coupled amplifier section and having fixed capacitance value; and
   providing variable impedance means coupled between said first and second capacitive means which is responsive to the gain control signal wherein the value of impedance of said variable impedance means is varied for reducing the magnitude of the impedance of the conductive path between said first and second capacitive means such that the bandpass characteristic is caused to be changed as the total capacitance of the balanced tuned stage is varied.

10. In combination with an amplifier section, having a balanced tuned input circuit coupled to first and second inputs of the amplifier section, a circuit having first and second inputs coupled to the balanced tuned circuit for electronically varying the total capacitance of the balanced tuned circuit wherein the bandpass characteristic thereof is varied, the circuit comprising:
   first and second capacitors each having a first plate connected to a respective one of the first and second inputs of the circuit and each having a second plate; and
   variable impedance means connected between said second plates of said first and second capacitors, said variable impedance means being responsive to a control signal being applied thereto such that the impedance between said second capacitors plates of said first and second is varied to cause the capacitance across the first and second inputs of the circuit to be varied.

* * * * *